United States Patent [19]
Koeman et al.

[11] Patent Number: 5,731,706
[45] Date of Patent: Mar. 24, 1998

[54] METHOD FOR EFFICIENT CALCULATION OF POWER SUM CROSS-TALK LOSS

[76] Inventors: Henriecus Koeman, 1022 C Ave., Edmonds, Wash. 98020-3904; Craig Vincent Johnson, 12908 49th Dr. SE., Everett, Wash. 98208

[21] Appl. No.: 801,653

[22] Filed: Feb. 18, 1997

[51] Int. Cl.$^6$ .................................................. G01R 27/28
[52] U.S. Cl. ........................... 324/628; 324/539; 364/483
[58] Field of Search ................................. 324/627, 628, 324/539, 540; 364/482, 483; 377/20; 379/24, 26

[56] References Cited

U.S. PATENT DOCUMENTS

| | | | |
|---|---|---|---|
| 2,696,531 | 12/1954 | Bourseau | 324/628 |
| 5,532,603 | 7/1996 | Bottman | 324/628 |
| 5,539,321 | 7/1996 | Sciacero | 324/628 |
| 5,548,222 | 8/1996 | Jensen | 324/628 |
| 5,570,029 | 10/1996 | Bottman | 324/628 |
| 5,633,801 | 5/1997 | Bottman | 364/482 |
| 5,644,617 | 7/1997 | Schmidt | 379/5 |

*Primary Examiner*—Ernest F. Karlsen
*Assistant Examiner*—Thomas Valone
*Attorney, Agent, or Firm*—Douglas J. Barker

[57] ABSTRACT

An efficient method for calculating Power Sum cross-talk loss is provided. Cross-talk loss measurements may include near-end cross-talk (NEXT) loss, far-end cross-talk (FEXT) loss, multiple disturber NEXT (MD NEXT) loss, and multiple disturber FEXT (MD FEXT) loss. Pair-to-Pair cross-talk loss responses are collected between a given wire pair and all the other wire pairs of concern, with each pair-to-pair cross-talk loss measurement having a number of frequency data points corresponding to the frequencies of interest. The pair-to-pair cross-talk loss response having the lowest positive value for a particular frequency data point is first selected as the baseline cross-talk loss response. The effects of each of the remaining pair-to-pair cross-talk loss responses on the baseline cross-talk loss response are then accounted for by applying power sum contribution values obtained from a look-up table. In this way, Estimated Power Sum cross-talk loss may be calculated for each of the corresponding frequency data points from each of the pair-to-pair cross-talk loss measurements in an efficient manner.

7 Claims, 6 Drawing Sheets

METHOD FOR EFFICIENT CALCULATION OF POWER SUM CROSS-TALK LOSS

BACKGROUND OF THE INVENTION

This invention relates generally to cable testing for data communications, and in particular to a method for more efficiently calculating the Power Sum cross-talk loss in local area network cables.

Local area networks (LAN's) now connect a vast number of personal computers, workstations, printers, and file servers in the modem office. A LAN system is typically implemented by physically connecting all of these devices with copper-conductor twisted-wire pair ("twisted-pair") LAN cables, the most common being an unshielded twisted-pair (type "UTP") LAN cable which is 8-wire cable which is configured as 4 twisted-wire pairs (4-pair cable). Each of the four twisted-wire pairs function as a transmission line which conveys a data signal through the LAN cable. Each end of the LAN cable is commonly terminated in a modular-type connector according to the international standard IEC 603-7 with pin assignments of type "RJ-45" which is referred to as a modular (RJ-45) connector. Modular (RJ-45) connectors may be in the form of plugs or jacks. A mated plug and jack is considered a connection.

Increasingly common in the industry are the use of 25 twisted-wire pair (25-pair) cables that are used to connect work areas containing a multitude of equipment. Such 25-pair cables simplify the task of installation since only one 25-pair cable need be pulled from the wiring closet to the work area instead of six 4-pair cables. A single 25-pair cable occupies far less space in a cable trough than separate 4-pair cables. 25-pair cables are typically applied in the interstitial spaces of a building such as the floor or ceiling, running from a central telecommunications closet to a transition connector near the work area. From the transition connector, 4-pair cables may be run to each piece of equipment such as workstations, printers, and file servers.

The tasks of installing, replacing, or re-routing LAN cables typically fall on a professional cable installer or in-house network specialist. During the installation phase, each cable is routed through the building and connected at both ends. Each wire in the cable must be connected to its proper respective electrical connection at both ends of the cable in order for the LAN connection to function properly. A LAN cable system that has been improperly installed, or has faulty cables or connectors, can result in data transmission errors. Therefore, the LAN cable system must be tested to verify proper connectivity and transmission performance.

At the same time, merely obtaining proper electrical continuity through a particular network link is no longer sufficient to ensure a properly functioning LAN cable system. More subtle problems can surface that may cumulatively destroy network performance at higher data rates. For this reason, LAN cables are now classified into different performance levels based on their ability to handle high speed data traffic. The network specialist must now be careful to select the appropriate minimum level. For example, the accidental inclusion of telephone-grade cable, which is physically similar to higher performance LAN cables but with unacceptable bandwidth and cross-talk characteristics, into a portion of the network may result in a non-functional network connection.

Near-end cross-talk (NEXT) is a measure of the level of isolation between any two twisted-wire pairs within a LAN cable as measured from the local or near-end of the LAN cable. The measured result generated by the test instrument is called the NEXT loss response. Maintaining a specified minimum level of NEXT loss is important in preventing interference between sets of twisted-wire pairs in order to maintain network reliability. The industry working group Telecommunications Industry Association (TIA) has promulgated a standard for cross-talk measurements commonly referred to as Telecommunications System Bulletin (TSB) 67 which specifies a minimum level of NEXT loss over a frequency range of 1 to 100 MegaHertz (MHz). Cross-talk is almost always expressed in decibels (dB). The NEXT loss standard essentially defines a pass-fail limit line for both basic link and channel configurations as defined in TSB 67 between sets of twisted-wire pairs. LAN cable networks with NEXT loss occurring worse than the limit line at any frequency are considered as falling. In maintaining a LAN cable network that complies with the TIA standard, the network specialist can be reasonably assured of full network performance with no significant error contributions from pair-to-pair NEXT loss.

Cross-talk measurement instruments are known in the art which measure pair-to-pair NEXT loss between sets of twisted-wire pairs. Pulse-based measurement instruments are discussed in U.S. Pat. No. 5,570,029, issued Oct. 29, 1996, to Bottman et at., Fluke Corporation assignee, which produces cross-talk versus frequency information. Improved accuracy in obtaining the NEXT measurement is discussed in U.S. Pat. No. 5,532,603, issued Jul. 2, 1996, to Jeffrey S. Bottman, Fluke Corporation assignee. Swept frequency analog techniques for measuring NEXT versus frequency are also well known in the art for obtaining pair-to-pair NEXT loss responses.

In addition to NEXT loss measurements, cross-talk loss measurements are also commonly understood in the industry to include far-end cross-talk (FEXT) loss. NEXT loss measurements are most popular for test instrument applications because the stimulus and response circuits are built within the same test instrument. Furthermore, NEXT loss is typically the most likely to cause performance problems in a LAN cable system due to its close proximity to the source and the receiver. Cross-talk loss response measurements, whether from pulse-based measurement instruments or from swept-frequency analog measurement instruments, and as NEXT and FEXT, are all in the form of pair-to-pair cross-talk loss responses that may be further processed to yield a Power Sum cross-talk loss. Multiple disturber NEXT (MD NEXT) and multiple disturber FEXT (MD FEXT) results are special variations of cross-talk loss responses which involve power sum addition of NEXT or FEXT components.

Because nearly every LAN cable includes more than two twisted-wire pairs, such as the 4-pair and 25-pair cables mentioned above, there is a growing emphasis on calculating Power Sum cross-talk loss which takes into account the individual pair-to-pair cross-talk loss contributions within the LAN cable. Power Sum cross-talk loss thus represents a stricter requirement for LAN cables. Like pair-to-pair cross-talk loss, Power Sum cross-talk loss varies as a function of frequency. Industry specifications call for frequency data points from 1 MHz to 31.25 MHz in 0.15 MHz intervals and from 31.25 MHz to 100 MHz in 0.25 MHz intervals for a total of 477 frequency data points to obtain a complete Power Sum NEXT loss measurement over the frequency range of interest. In the preferred embodiment of the present invention, 1550 frequency data points are provided over a frequency range of 0.1 MHz to 155 MHz in 0.1 MHz intervals.

The equations that follow are in terms of NEXT. The other forms of cross-talk, including FEXT, MD NEXT, and MD FEXT, may be readily substituted to obtain a similar result in terms of a Power Sum cross-talk loss. Power Sum NEXT loss as expressed in dB is calculated according to the following equation:

$$\text{Power Sum NEXT} = 10 \log_{10} \sum_{i=1}^{n} 10^{\left[\frac{-NEXT_i}{10}\right]}$$

where:

$NEXT_i$ is the pair-to-pair NEXT expressed in dB for a given set of wire pairs; and n is the number of pairs being measured minus 1

For example, in a 4-pair cable having wire pairs 1, 2, 3, and 4 which form sets 1-2, 1-3, and 1-4, Power Sum NEXT would be calculated according to the following equation:

$$NEXT_{PS} = -10 \log \left[ 10^{\left[\frac{-NEXT_1}{10}\right]} + 10^{\left[\frac{-NEXT_2}{10}\right]} + 10^{\left[\frac{-NEXT_3}{10}\right]} \right]$$

where:

$NEXT_{ps}$ is the power sum NEXT loss $NEXT_1$ is the NEXT loss between pairs 1 and 2

$NEXT_2$ is the NEXT loss between pairs 1 and 3

$NEXT_3$ is the NEXT loss between pairs 1 and 4

Because the Power Sum NEXT loss must be calculated according to the above equation for each of the frequency data points for each of the $NEXT_1$, $NEXT_2$ and $NEXT_3$ to cover the frequency range of interest and each calculation necessarily involves the use of the decimal (base 10) power and logarithmic functions, the calculation becomes computationally intensive. Even with the increased microprocessor speeds presently available, a calculation of Power Sum NEXT loss may require an unacceptably long period of time, typically exceeding one minute using a commercially-available microprocessor used for instrument control. This processing-time problem is particular acute in applications involving measurement instruments built into a battery-operated, portable instrument package, where limited physical space and power consumption impose substantial limitations on the on-board processing power. Therefore, it would be desirable to provide an efficient method for calculating Power Sum NEXT loss which substantially reduces the processing time required.

SUMMARY OF THE INVENTION

In accordance with the present invention, an efficient method for calculating Power Sum NEXT loss is provided. Pair-to-Pair NEXT loss responses are collected between each set of wire pairs, with each pair-to-pair NEXT loss measurement having a number of frequency data points corresponding to the frequencies of interest. Each pair-to-pair NEXT loss response is expressed in decibels (dB).

For example, a 4-pair cable would have three pair-to-pair NEXT loss responses, $NEXT_1$, $NEXT_2$, and $NEXT_3$, corresponding to the sets 1-2, 1-3, and 1-4 respectively, with each NEXT loss response in the form of a data array having 1550 frequency data points spanning the frequency range of 0.1 MHz to 155 MHz in 0.1 MHz increments.

It was recognized that the lowest value of pair-to-pair NEXT loss is the primary contributor to Power Sum NEXT loss and thus determines the baseline NEXT loss. It was also recognized that NEXT loss contributions from other sets of wire pairs will affect this primary contributor according to an amount that may be calculated to an acceptable degree of accuracy using power sum contribution values from a look-up table. The various power sum contribution values from the other sets of wire pairs may be subtracted from the baseline NEXT loss to obtain an estimated Power Sum NEXT loss.

First, the pair-to-pair NEXT loss response having the lowest positive value for a particular frequency data point is selected as the baseline NEXT loss response. This baseline NEXT loss response is named $NEXT_a$. The remaining pair-to-pair NEXT loss responses are named $NEXT_b$ and $NEXT_c$ which may be in any order.

Second, the effects of each of the remaining pair-to-pair NEXT loss responses $NEXT_b$ and $NEXT_c$ on the baseline NEXT loss response $NEXT_a$ are accounted for by applying power sum contribution values which are obtained from a look-up table. The look-up table provides the power sum contribution values from a table of pre-calculated power sum contribution values and thus avoids the computationally intense steps involving logarithms and exponentials according to the general equation. The first power sum contribution value $\Delta_1$ is provided from the look-up table according to the difference between $NEXT_a$ and $NEXT_b$.

$$\Delta_1 = f_{table}(NEXT_a - NEXT_b)$$

The second power sum contribution value $\Delta_2$ is provided from the same look-up table according to the difference between $(NEXT_a - \Delta_1)$ and $NEXT_c$.

$$\Delta_2 = f_{table}((NEXT_a - \Delta_1) - NEXT_c)$$

In a like manner, power sum contribution values for any other sets of twisted-wire pairs can be iteratively obtained from the same look-up table. Estimated Power Sum NEXT loss can now be expressed according to the following equation:

$$\text{Estimated Power Sum NEXT} = NEXT_a - \Delta_1 - \Delta_2$$

In this way, Estimated Power Sum NEXT loss may be calculated for each of the corresponding frequency data points from the pair-to-pair NEXT loss measurements collected in an efficient manner. Estimated Power Sum cross-talk loss for any other type of cross-talk may be calculated from pair-to-pair cross-talk loss responses in the same manner.

One object of the present invention is to provide a method for efficiently calculating Power Sum cross-talk loss.

Another object of the present invention is to provide a method for efficiently calculating Power Sum cross-talk loss using a look-up table containing power sum contribution values.

An additional object of the present invention is to provide a measurement instrument for efficiently producing Power Sum cross-talk loss measurements.

Other features, attainments, and advantages will become apparent to those skilled in the art upon a reading of the following description when taken in conjunction with the accompanying drawings.

DETAILED DESCRIPTION OF THE INVENTION

Figure 1:
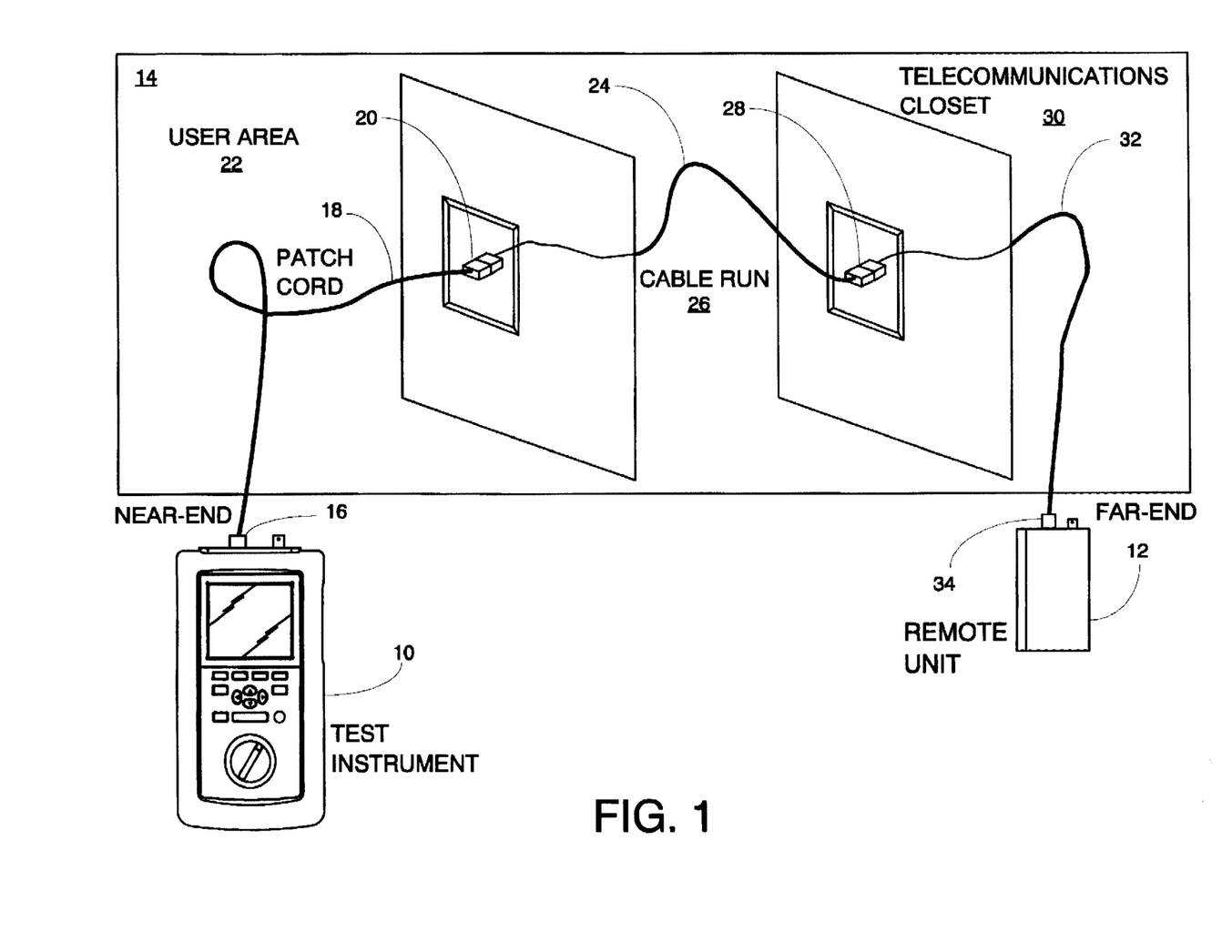
FIG. 1 is an illustration (not to scale) of a test instrument applied in testing the Power Sum NEXT loss of a LAN cable system.

FIG. 1 is an illustration of a test instrument 10 and a remote unit 12 coupled to the near-end and the far-end respectively of a typical LAN cable system 14. The terms near-end and far-end are adopted by convention to mean the respective ends of LAN cable connection, with the near-end being that with the test instrument 10 and the far-end being the opposite end. A test instrument 10 is coupled via a near-end connector 16 and a patch cord 18 to a connector 20.

The test instrument 10 is typically applied in a user area 22 in which the desired peripherals such as computer workstations and printers are located in a typical office environment. The connector 20 is connected to a LAN cable 24 located in a cable run 26. The cable run 26 is the route of the LAN cable 20 through the physical facility, and may run under floors, through walls, above ceilings, and other spaces within the facility.

The LAN cable 24 may be constructed as a 4-pair cable or as a 25-pair cable which has transition connectors (not shown) on either end for connection to 4-pair cables. As a 4-pair cable, the LAN cable system from the near-end to the far-end may be tested using a Power Sum cross-talk loss measurement to guarantee higher system performance than simply using separate pair-to-pair cross-talk loss measurements.

The cable run 26 tends to be long in many situations and the work area 22 contains multiple numbers of devices such as printers, workstations, and file servers that need to be connected to a central distribution point located in a telecommunication closet 30. The cable troughs in the cable run 26 tend to get crowded and the process of installing and maintaining multiple numbers of the LAN cable 24 may get overly complex. For these reasons, the LAN cable 24 may be constructed using a 25-pair cable with transition connectors (not shown) on either end of the LAN cable 24 to convert back to multiple 4-pair cables for connection to the connectors 20 and 28. The power sum NEXT loss measurement by the test instrument 10 may also be used in this situation to guarantee higher system performance than simply using separate pair-to-pair cross-talk loss measurements to compensate for the increased possibility of cross-talk by wire-pairs not included in the 4-pair data channel.

The LAN cable 24 is coupled to a connector 28 which appears at the telecommunications closet 30. A patch cable 32 coupled to a far-end connector 34 completes the LAN cable system 14. To facilitate the testing of the LAN cable system 14 in terms of pair-to-pair NEXT loss, the remote unit 12 is coupled to the far-end connector 34 to provide a proper termination of the test signals generated by the test instrument 10. The test instrument 10 normally provides the ability to obtain pair-to-pair NEXT loss responses between each set of wire-pairs of interest.

The test instrument 10 further provides the ability to compute a Power Sum NEXT loss using the pair-to-pair NEXT loss responses in an efficient manner according to the method of the present invention as explained in more detail below. The test instrument 10 may be applied in measuring the Power Sum NEXT loss of the individual segments of the LAN cable system 14 such as the patch cord 18 which is typically 4-pair cable and the LAN cable 24 which is may be 4-pair or 25-pair cable as explained above.

Figure 2:
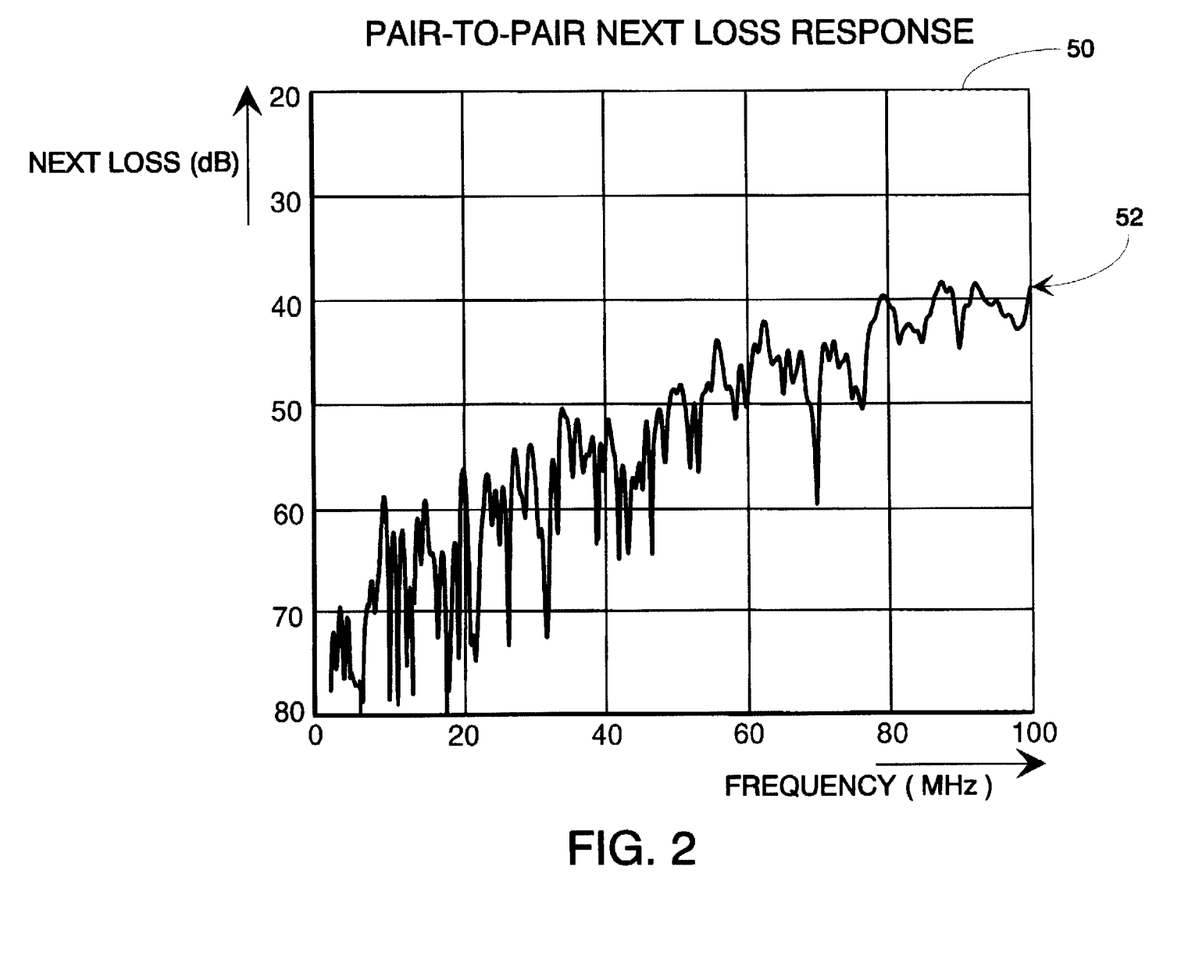
FIG. 2 is a graph of pair-to-pair NEXT loss expressed in terms of NEXT loss versus frequency.

In FIG. 2, there is shown a graph of a typical pair-to-pair NEXT loss response in dB versus frequency. A trace 52 is representative of a typical pair-to-pair NEXT loss response which may be collected by the test instrument 10 using either swept-frequency analog or pulse-based measurement techniques. Each pair-to-pair NEXT loss response is a collection of frequency data points typically implemented as a data array with the results stored in memory. The vertical scale of NEXT loss as shown is in the form of positive decibel (dB) numbers. Because lower positive numbers on the vertical scale represent an increased level of NEXT, higher positive numbers are generally more desirable for achieving a desired level of performance in the LAN system 14. Because NEXT loss varies as a function of frequency, the computation of Power Sum NEXT loss is performed for each frequency data point.

Figure 3:
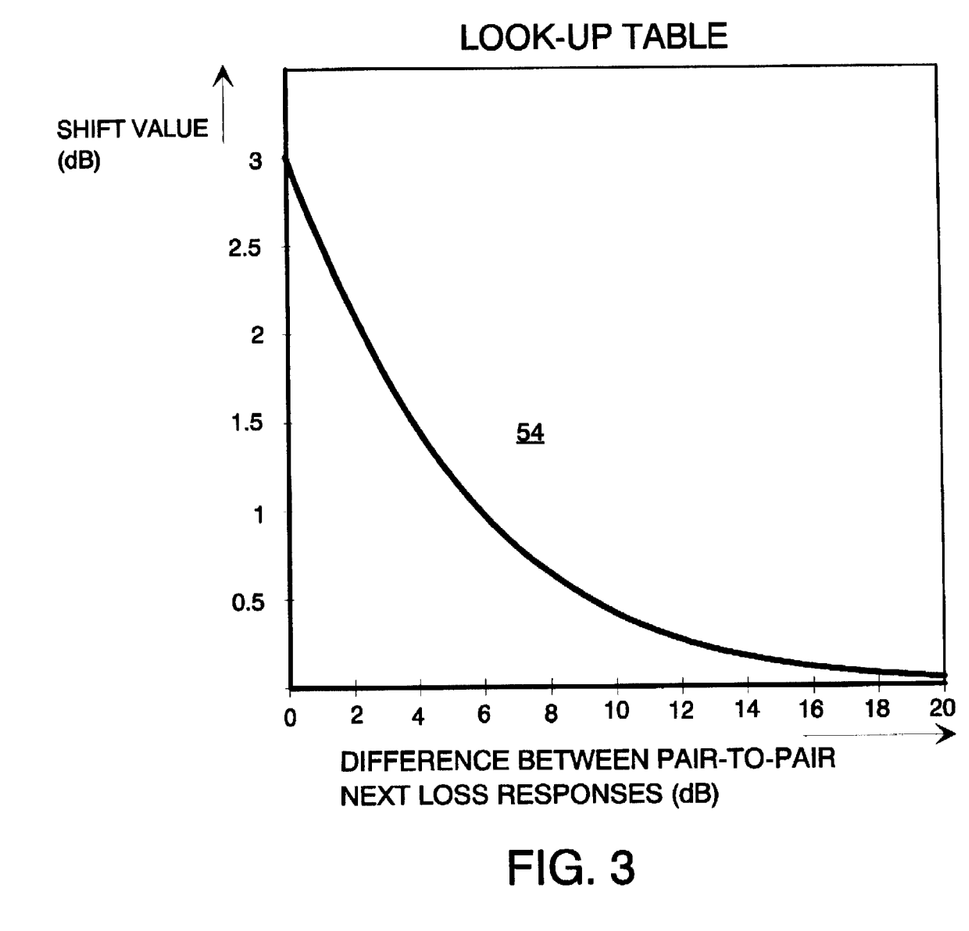
FIG. 3 is a graph of the values stored in the look-up table containing power sum contribution values according to the present invention.

In FIG. 3, there is shown a graph of the contents of a look-up table 54 which provides power sum contribution values for the baseline NEXT loss as a function of the difference between the baseline NEXT loss and another pair-to-pair NEXT loss expressed as the following equation.

$$\Delta_1 = f_{table}(NEXT_a - NEXT_b)$$

where:

$\Delta_1$ is the power sum contribution value from the baseline NEXT loss;

$NEXT_a$ is the NEXT loss between any of the sets of wire pairs and represents the lowest positive number for the selected frequency data point and which is selected as the baseline NEXT response;

$NEXT_b$ is the NEXT loss between any other set of wire pairs

The power sum contribution value $\Delta_1$ returned from the look-up table 54 is an estimated value calculated to a predetermined level of precision which is returned for each of the other pair-to-pair NEXT losses. In the preferred embodiment, six data points are calculated according to the general equation, with other data points linearly interpolated from the six calculated data points. NEXT loss contributions from pair-to-pair NEXT loss differences exceeding 20 dB are ignored as being insignificant. Greater or fewer numbers of calculated versus interpolated data points may be used in the look-up table 54 depending on the accuracy of the estimate required and the available memory space for storing the data for the look-up table 54.

The power sum contribution values $\Delta_1$ are all expressed in dB and may thus be subtracted from the baseline NEXT loss without having to use decimal logarithmic and exponential functions which are computationally intensive, thus resulting in substantial time savings in obtaining the Power Sum NEXT loss.

The look-up table 54 is calculated according to the following equation.

$$\Delta_1 = 10 \log \left[ 1 + 10^{[\frac{NEXT_a - NEXT_b}{10}]} \right]$$

Over different frequency data points, different pair-to-pair NEXT loss responses may form the baseline NEXT loss response and the above equation applies generally for each power sum contribution value due to the contributions of the other pair-to-pair NEXT loss responses. Thus, the same look-up table 54 is used for calculating the power sum contribution values for each pair-to-pair NEXT loss response over each frequency data point.

The equation for calculating the look-up table values is derived as follows. From the general equation for Power Sum NEXT:

$$NEXT_{PS} = -10 \log \left[ 10^{[\frac{-NEXT_a}{10}]} + 10^{[\frac{-NEXT_b}{10}]} + 10^{[\frac{-NEXT_c}{10}]} \right]$$

both sides may be raised to the power of 10 to obtain:

$$10^{[\frac{-NEXT_{PS}}{10}]} = 10^{[\frac{-NEXT_a}{10}]} + 10^{[\frac{-NEXT_b}{10}]} + 10^{[\frac{-NEXT_c}{10}]}$$

and the equation may be combined to yield a component labeled Subtotal:

$$10^{[\frac{-NEXT_{PS}}{10}]} = 10^{[\frac{-Subtotal}{10}]} + 10^{[\frac{-NEXT_c}{10}]}$$

where:

Subtotal is the portion of $NEXT_{ps}$ with the effects of $NEXT_b$ taken into account Subtotal may be simplified to yield the following equations:

$$Subtotal = NEXT_a - 10 \log \left[ 1 + 10^{[\frac{NEXT_a - NEXT_b}{10}]} \right]$$

$$Subtotal = NEXT_a - \Delta_1$$

The equation for calculating the power sum contribution value thus becomes:

$$\Delta_1 = 10 \log \left[ 1 + 10^{[\frac{NEXT_a - NEXT_b}{10}]} \right]$$

According to the above equations, an estimated value for Power Sum NEXT using power sum contribution values obtained from the look-up table for a 4-pair cable thus becomes:

Estimated Power Sum $NEXT = NEXT_a - \Delta_1 - \Delta_2$

In the present invention, it was found that the Estimated Power Sum NEXT loss yielded results typically within 0.1 dB and not exceeding 0.2 dB from the Power Sum NEXT loss calculated according to general equation, based on the 0.1 dB resolution of the NEXT values applied. The look-up table values may be all calculated according to the above equation or some values may be interpolations of calculated points. Continuing with this same method for additional sets of wire pairs such as in the 25-pair cable, the Estimated Power Sum NEXT loss may be calculated using as many pair-to-pair cross-talk loss responses as are available and to be included in the Power Sum NEXT loss calculation.

Figure 4:
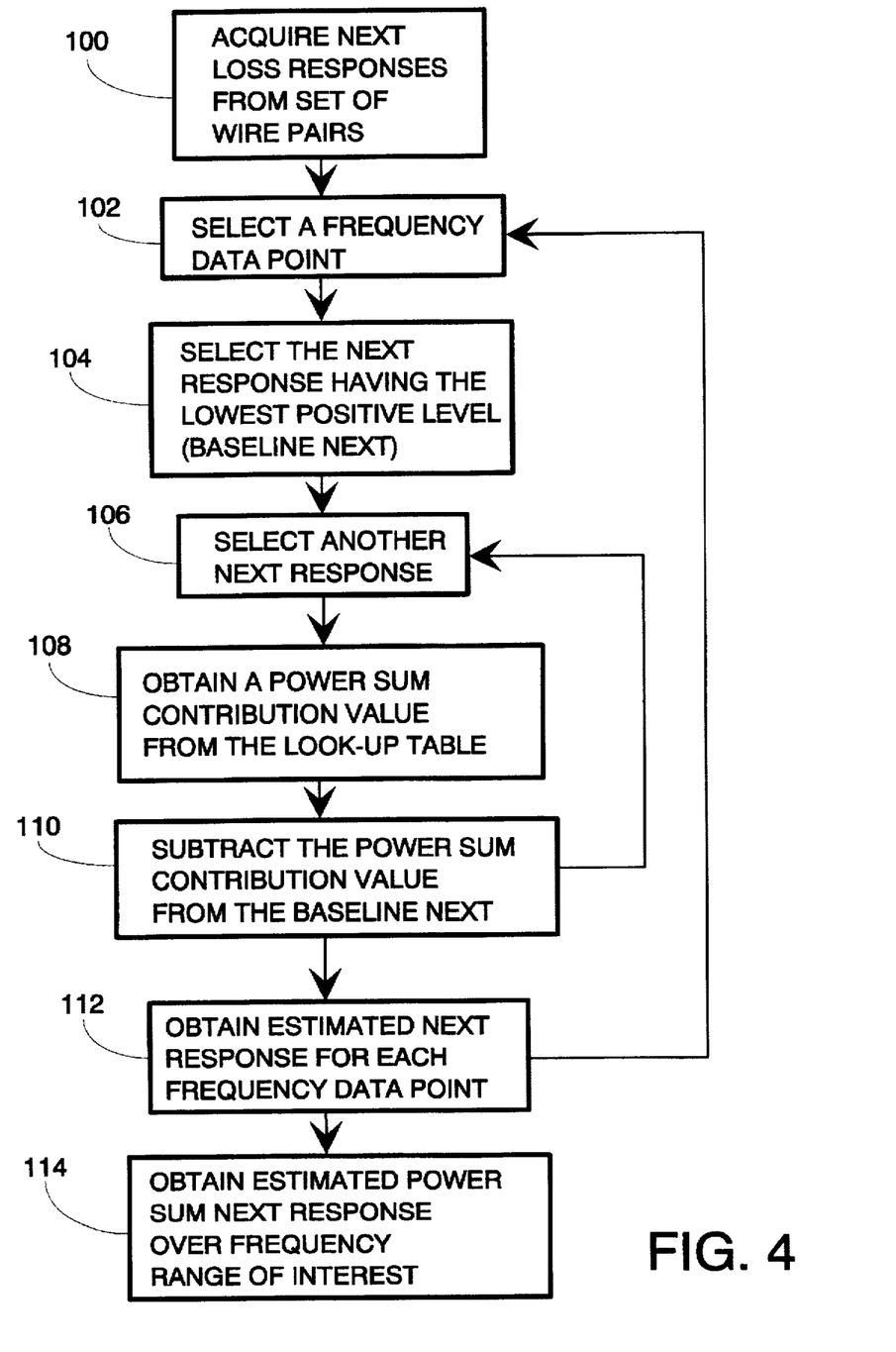
FIG. 4 is a flow chart for efficiently calculated Power Sum cross-talk loss according to the present invention using the look-up table values illustrated in FIG. 3.

In FIG. 4, there is shown a flow diagram of the method of efficiently calculating Power Sum NEXT loss according to the present invention. In step 100 ACQUIRE NEXT LOSS RESPONSES FROM EACH SET OF WIRE PAIRS, the test instrument 10 is coupled to the LAN cable system 14 to be tested and pair-to-pair NEXT loss responses for each set of wire pairs are measured and stored in memory as expressed in dB. Each set of pair-to-pair NEXT loss responses contains a set of frequency data points. Only the sets of wire pairs of interest need be measured to obtain the pair-to-pair NEXT loss response, for example if it is known that the cross-talk contribution of some wire pairs is not of interest or of no significance to the estimated Power Sum NEXT loss. For example, for a 4-pair cable, pair-to-pair NEXT losses comprising $NEXT_1$, $NEXT_2$, and $NEXT_3$ are obtained.

In step 102 labeled SELECT A FREQUENCY DATA POINT, the Power Sum NEXT loss may be calculated over each of the frequency data points corresponding to those in the pair-to-pair NEXT loss responses. In the preferred embodiment, the Power Sum NEXT loss is calculated sequentially over each of the frequency data points.

In step 104 labeled SELECT THE NEXT RESPONSE HAVING THE LOWEST POSITIVE LEVEL, the pair-to-pair NEXT loss response having the lowest positive number for the selected frequency data point among all the pair-to-pair NEXT loss responses that have been collected, which by convention forms the worst NEXT performance, is selected to be the baseline NEXT loss response for that selected frequency data point. For example, $NEXT_a$ has the lowest positive number for the selected frequency data point and thus forms the baseline NEXT response for that selected frequency data point.

In step 106 labeled SELECT ANOTHER NEXT RESPONSE, a pair-to-pair NEXT loss response gathered in the step 100 other than the baseline NEXT loss response is selected. Each of the pair-to-pair NEXT responses is selected in turn so that its effects on the baseline NEXT loss response may be accounted for. Thus, the effects of $NEXT_b$ and then $NEXT_c$ can then be accounted for.

In step 108 labeled OBTAIN A POWER SUM CONTRIBUTION VALUE FROM THE LOOK-UP TABLE, the difference between the baseline NEXT loss response $NEXT_a$ and the other pair-to-pair NEXT loss response $NEXT_b$ are used to obtain a power sum contribution value $\Delta_1$ from the look-up table 54 according to the following formula.

$$\Delta_1 = f_{table}(NEXT_a - NEXT_b)$$

In step 110 labeled SUBTRACT THE POWER SUM CONTRIBUTION VALUE FROM THE BASELINE NEXT VALUE, the power sum contribution value is subtracted from the baseline NEXT loss response. The steps 106–110 iteratively repeat for each additional pair-to-pair NEXT response to arrive at the Estimated Power Sum NEXT loss.

Estimated Power Sum $NEXT = NEXT_a - \Delta_1 - \Delta_2$

In this way, Estimated Power Sum NEXT loss may be calculated for each of the corresponding frequency data points from the pair-to-pair NEXT loss responses collected. In this example for the 4-pair cable, only two such power sum contribution values, $\Delta_1$ and $\Delta_2$, are subtracted from the baseline NEXT loss response.

In step 112 labeled OBTAIN ESTIMATED NEXT RESPONSE FOR EACH FREQUENCY DATA POINT, the Estimated Power Sum NEXT loss is calculated for each of the frequency data points of interest. The steps 102–112 repeat until each of the frequency data points has been calculated.

In step 114 labeled OBTAIN ESTIMATED POWER SUM NEXT LOSS, the complete Power Sum NEXT loss covering the frequency range of interest has been calculated and is typically in the form of a data array indexed by frequency data point. The Estimated Power Sum NEXT loss may then be provided in graphical or numerical form to the user of the test instrument 10 for further analysis.

Figure 5:
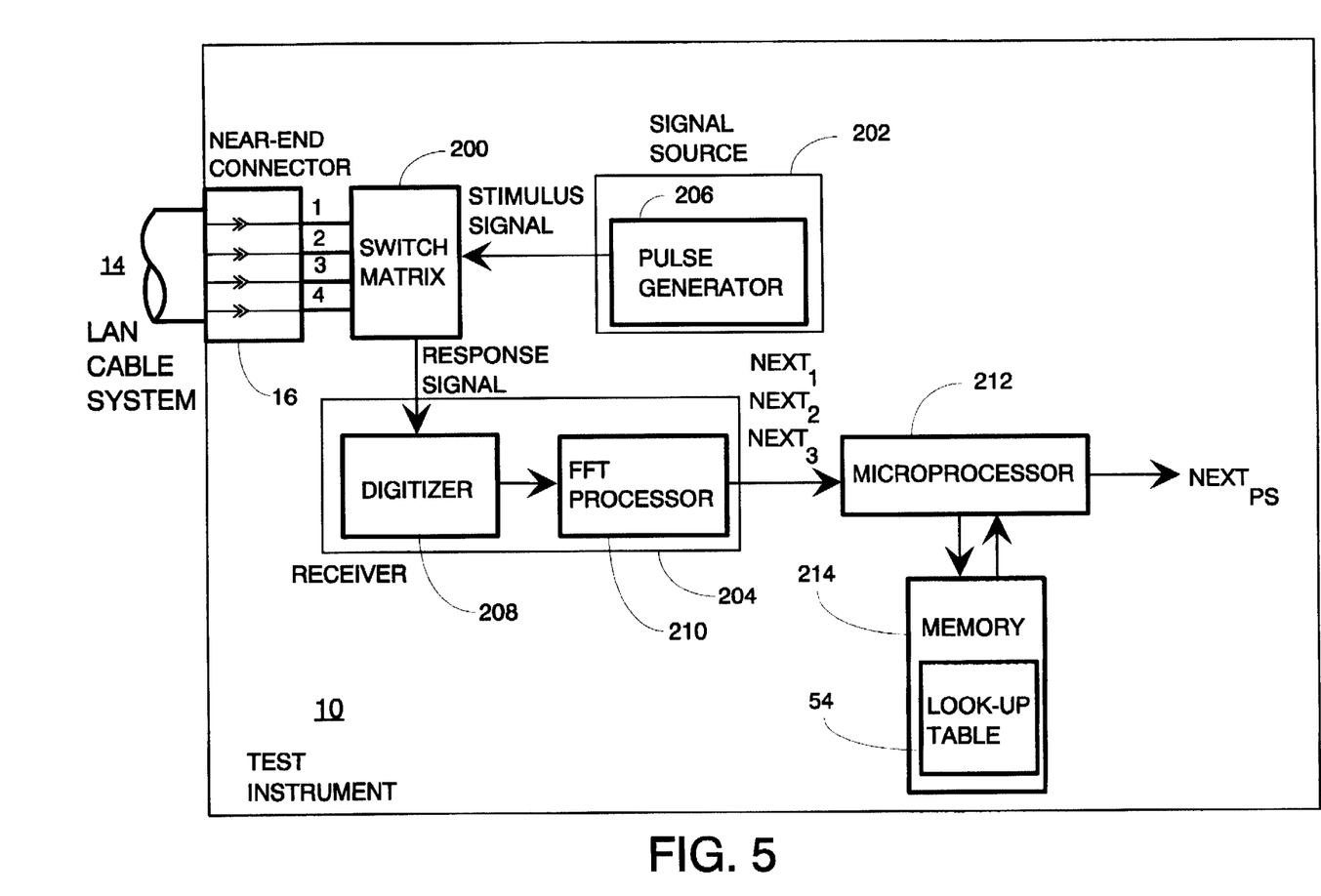
FIG. 5 is a simplified block diagram of the test instrument shown in FIG. 1 according to the preferred embodiment of the present invention.

FIG. 5 is a simplified block diagram of the test instrument 10 (shown in FIG. 1) according to the preferred embodiment of the present invention. The near-end connector 16 is coupled to the wire pairs 1-4 contained within the LAN cable system 14. The wire pairs 1-4 are further coupled to a switch matrix 200. The switch matrix 200 selects a set of wire pairs 1-4 to measure by selectively coupling one of the wire pairs 1-4 to an output of a signal source 202 and further selectively coupling another of the wire pairs 1-4 to an input of a receiver 204.

The receiver 204 receives a response signal in response to a stimulus signal generated by the signal source 202 to produce a pair-to-pair cross-talk loss response for the set of wire pairs. The pair-to-pair cross-talk loss response is normally collected over a series of frequency data points for the selected frequency range of interest. Because both the signal source 202 and the receiver 204 are at the near-end of the LAN cable system 14, the cross-talk is of the type NEXT. Three set of pair-to-pair NEXT loss responses collected as $NEXT_1$, $NEXT_2$, and $NEXT_3$, corresponding to the sets of wire pairs 1-2, 1-3, and 1-4, for example.

In the preferred embodiment, the signal source 202 comprises a pulse generator 206 which generates a series of pulses as the stimulus signal. The receiver 204 comprises a digitizer 208 which digitizes the response signal to produce a pulse response time record. The pulse response time record is provided to a Fast Fourier Transform (FFT) processor 210 which produces the pair-to-pair NEXT loss responses $NEXT_1$, $NEXT_2$, and $NEXT_3$ which are provided to a microprocessor 212 for further processing to produce the estimated Power Sum NEXT loss.

The look-up table 54 is stored in a memory 214 which is coupled to the microprocessor 212. Using the look-up table values and the pair-to-pair NEXT loss responses collected as $NEXT_1$, $NEXT_2$, and $NEXT_3$ the microprocessor 212 produces the estimated cross-talk loss response as explained in more detail above.

Figure 6:
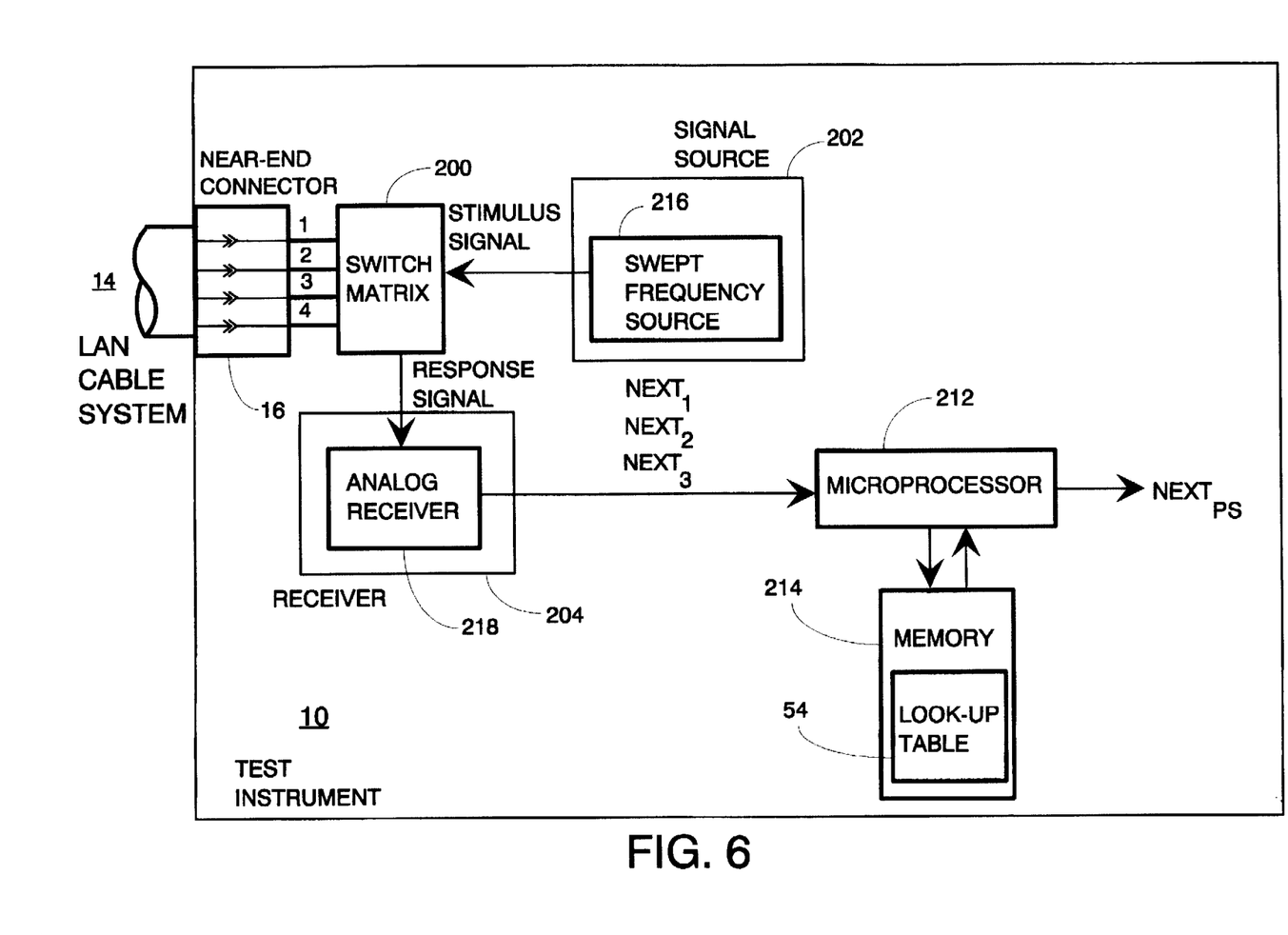
FIG. 6 is a simplified block diagram of the test instrument shown in FIG. 1 according to an alternative embodiment of the present invention.

FIG. 6 is a simplified block diagram of the test instrument 10 (shown in FIG. 1) according to an alternative embodiment of the present invention with the signal source 202 and receiver 204 implemented using analog swept frequency technology rather than digital pulse-based technology as shown for the preferred embodiment. The signal source 202 comprises a swept frequency source 216 which produces the stimulus signal in the form of a sine wave at each of the frequency data points of interest. The receiver 204 comprises an analog receiver 218 which receives the response signal and measures its amplitude for each of the frequency data points of interest. The collection of such measurements over each set of wire pairs, when suitably calibrated, provides the pair-to-pair NEXT loss responses collected as $NEXT_1$, $NEXT_2$, and $NEXT_3$.

The look-up table 54 is stored in the memory 214 which is coupled to the microprocessor 212. Using the look-up table values and the pair-to-pair NEXT loss responses collected as $NEXT_1$, $NEXT_2$, and $NEXT_3$, the microprocessor 212 produces the estimated cross-talk loss response as explained in more detail above.

It will be obvious to those having ordinary skill in the art that many changes may be made in the details of the above described preferred embodiments of the invention without departing from the spirit of the invention in its broader aspects. For example, the baseline NEXT loss, designated as $NEXT_1$, although yielding the most efficient use of look-up table values, need not be found. Instead, a NEXT loss value may be chosen arbitrarily as the base-line NEXT loss and then have power sum contribution values applied to it. Furthermore, the above equations may be readily extended to calculate the estimated Power Sum NEXT for cables having greater numbers of wire-pairs such as the 25-pair cable. The look-up table may be readily modified to achieve the amount of accuracy required for the estimated Power Sum NEXT. Therefore, the scope of the present invention should be determined by the following claims.

What we claim as our invention is:

1. A method for efficiently calculating Power Sum cross-talk loss comprising:
   (a) acquiring a plurality of pair-to-pair cross-talk loss responses;
   (b) selecting one of said pair-to-pair cross-talk loss responses having the lowest cross-talk performance of said plurality of said pair-to-pair cross-talk loss responses as a baseline NEXT response;
   (c) obtaining power sum contribution values for each of the other pair-to-pair cross-talk loss responses from a look-up table; and
   (d) subtracting each of said power sum contribution values from said baseline cross-talk response to obtain an estimated Power Sum cross-talk response.

2. A method for efficiently calculating Power Sum cross-talk loss according to claim 1 wherein each of said pair-to-pair cross-talk loss responses comprises a plurality of frequency data points.

3. A method for efficiently calculating Power Sum cross-talk loss according to claim 2 further comprising obtaining said estimated Power Sum cross-talk response over each of said plurality of frequency data points.

4. A method for efficiently calculating Power Sum cross-talk loss according to claim 1 further comprising obtaining each of said power sum contribution values from said look-up table responsive to differences between said baseline cross-talk loss and each said pair-to-pair cross-talk loss responses.

5. A method for efficiently calculating Power Sum cross-talk loss according to claim 1 wherein each of said cross-talk loss responses further comprises one of a near-end cross-talk loss response, a far-end cross-talk loss response, a multiple disturber far-end cross-talk loss response, and a multiple disturber near-end cross-talk loss response.

6. A method for efficiently calculating Power Sum cross-talk loss comprising:
   (a) acquiring a plurality of pair-to-pair cross-talk loss responses wherein each of said pair-to-pair cross-talk loss responses comprises a plurality of frequency data points;
   (b) selecting one of said pair-to-pair cross-talk loss responses having the lowest cross-talk performance of said plurality of said pair-to-pair cross-talk loss responses as a baseline NEXT response for each of said plurality of frequency data points;
   (c) obtaining power sum contribution values for each of the other pair-to-pair cross-talk loss responses from a look-up table; and
   (d) subtracting each of said power sum contribution values from said baseline cross-talk response to obtain an estimated Power Sum cross-talk response over each of said plurality of frequency data points.

7. A method for efficiently calculating Power Sum cross-talk loss according to claim 6 wherein each of said cross-talk loss responses further comprises one of a near-end cross-talk loss response, a far-end cross-talk loss response, a multiple disturber far-end cross-talk loss response, and a multiple disturber near-end cross-talk loss response.

* * * * *